(12) United States Patent
Troost et al.

(10) Patent No.: US 8,259,285 B2
(45) Date of Patent: Sep. 4, 2012

(54) LITHOGRAPHIC SYSTEM, DEVICE MANUFACTURING METHOD, SETPOINT DATA OPTIMIZATION METHOD, AND APPARATUS FOR PRODUCING OPTIMIZED SETPOINT DATA

(75) Inventors: Kars Zeger Troost, Waalre (NL); Jason Douglas Hintersteiner, Norwalk, CT (US); Patricius Aloysius Jacobus Tinnemans, Hapert (NL); Wenceslao A. Cebuhar, Norwalk, CT (US); Ronald P. Albright, Norwalk, CT (US); Bernardo Kastrup, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 699 days.

(21) Appl. No.: 11/638,675

(22) Filed: Dec. 14, 2006

(65) Prior Publication Data

US 2008/0143982 A1 Jun. 19, 2008

(51) Int. Cl.
*G03B 27/42* (2006.01)
(52) U.S. Cl. .................... 355/53; 355/55; 355/67
(58) Field of Classification Search .............. 355/30, 355/53; 359/291
See application file for complete search history.

(56) References Cited

U.S. PATENT DOCUMENTS

| | | | |
|---|---|---|---|
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,956,692 B2 | 10/2005 | Duerr et al. |
| 7,177,012 B2 | 2/2007 | Bleeker et al. |
| 7,646,906 B2 | 1/2010 | Saidin et al. |
| 2003/0233630 A1 | 12/2003 | Sandstrom et al. |
| 2004/0041104 A1 | 3/2004 | Liebregts et al. |
| 2004/0130561 A1 | 7/2004 | Jain |
| 2005/0007572 A1 | 1/2005 | George et al. |

(Continued)

FOREIGN PATENT DOCUMENTS

EP 1 628 157 A1 2/2006

(Continued)

OTHER PUBLICATIONS

European Search Report for Application No. EP 07 25 4677 mailed May 13, 2008, 13 pgs.

(Continued)

*Primary Examiner* — Toan Ton
*Assistant Examiner* — Mesfin T Asfaw
(74) *Attorney, Agent, or Firm* — Sterne, Kessler, Goldstein & Fox P.L.L.C (57) ABSTRACT

An iterative method of producing optimized setpoint data for controlling the actuation of elements of an array of individually controllable elements in a maskless system and systems therefore. The optimization is based on estimation of a device structure that can utilizes one or more of the following factors: the low-pass characteristics of the projection system, the configuration of the illumination system, and the process window properties.

25 Claims, 6 Drawing Sheets

U.S. PATENT DOCUMENTS

2006/0208205 A1    9/2006    Chen et al.

FOREIGN PATENT DOCUMENTS

| | | |
|---|---|---|
| EP | 1 647 864 A1 | 4/2006 |
| JP | 2006-501525 A | 1/2006 |
| JP | 2006-135312 A | 5/2006 |
| JP | 2006-210936 A | 8/2006 |
| JP | 2007-519981 A | 7/2007 |
| WO | WO 98/33096 A1 | 7/1998 |
| WO | WO 98/38597 A2 | 9/1998 |
| WO | WO 98/38597 A3 | 9/1998 |
| WO | WO 2004/032000 A1 | 4/2004 |
| WO | WO 2005/073807 A1 | 8/2005 |

OTHER PUBLICATIONS

Mack, Chris A., "Lithographic Simulation: A Review", Proceedings of the SPIE, vol. 4440, Jul. 29, 2001, pp. 59-72.

Translation of Notification of Reason(s) for Refusal of Japanese Patent Application 2007-321286, dispatch date Oct. 5, 2010, 3 pages.

LITHOGRAPHIC SYSTEM, DEVICE MANUFACTURING METHOD, SETPOINT DATA OPTIMIZATION METHOD, AND APPARATUS FOR PRODUCING OPTIMIZED SETPOINT DATA

BACKGROUND

1. Field of the Invention

The present invention relates to a lithographic system, a method for manufacturing a device, and an apparatus and method for optimizing setpoint data for an array of individually controllable elements.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

A chip layout tool or similar design utility can be used to define a target device structure that a user wishes to generate on a substrate. The target device structure can be output from such a utility in a standard vector-based format such as GDSII or OASIS.

The target device structure defined in the vector-based format output file has infinitely sharp edges and corners. It does not take into account limitations in the projection system that will project the patterned radiation beam, nor in the post-processing steps that will be used to process the irradiated substrate in order to form a device structure.

Diffraction effects will cause the projection system to have a restricted (spatial) frequency response, causing in particular a low pass-filter behavior (in the spatial frequency domain). The post-processing steps can have a similar effect, acting broadly to blur the device structure relative to the dose-to-clear contour defined by the radiation dose pattern exposed onto the substrate.

One approach for correcting for these effects is by modifying the vector-based format output file to incorporate corrective features, also known as "optical proximity corrections" (OPCs).

The OPCs can be derived by theoretical modeling of the system. This can include calculation of the device structure that would result from use of a mask corresponding to the vector-based format output file with a particular projection system and post-processing regime. OPCs can then be added to the mask and the calculation repeated iteratively for different OPCs until a difference between the calculated device structure and the vector-based format output file falls within acceptable bounds.

Where a maskless system is to be used to emulate a physical mask, the same OPCs as were calculated for the mask-based system can be used, but care needs to be taken to ensure the array(s) of individually controllable elements in the maskless system behave(s) in the same way as the physical mask. Due to physical differences in the array(s) of individually controllable elements and the way the array(s) of individually controllable elements interact with the radiation beam in comparison with physical masks, accurate emulation can be difficult to achieve.

Therefore, what is needed is a system and method to improve the accuracy of device structures formed by maskless lithography systems.

SUMMARY

In one embodiment of the present invention, there is provided a method of producing optimized setpoint data for controlling the actuation of elements of an array of individually controllable elements configured to modulate a radiation beam in a maskless lithography system. The maskless lithography system has an illumination system configured to condition the radiation beam and a projection system configured to project the modulated radiation beam onto a substrate. The method comprises: a) obtaining starting setpoint data; b) estimating the device structure that would result from applying the starting setpoint data to the array of individually controllable elements configured to modulate a radiation beam; c) comparing the device structure estimated in step (b) with a target device structure to be formed on a substrate to determine a device structure error; d) modifying the setpoint data and repeating steps (b) and (c) using the modified setpoint data instead of the starting setpoint data until the device structure error falls below a predetermined threshold; and e) outputting the modified setpoint data for which the device structure error is below the predetermined threshold as the optimized setpoint data.

In another embodiment of the present invention, there is provided an apparatus for producing optimized setpoint data for controlling the actuation of elements of an array of individually controllable elements configured to modulate a radiation beam in a maskless lithography system. The maskless lithography system has an illumination system configured to condition the radiation beam and a projection system configured to project the modulated radiation beam onto a substrate. The apparatus comprises device structure estimating device and a setpoint data optimizer. The device structure estimating device is for estimating the device structure that would result from applying given setpoint data to the array of individually controllable elements configured to modulate a radiation beam. The setpoint data optimizer is arranged iteratively to estimate the device structure using the device structure estimated device and different setpoint data until a difference between the estimated device structure and a target device structure to be formed on a substrate is smaller than a predetermined threshold, thus determining optimized setpoint data.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
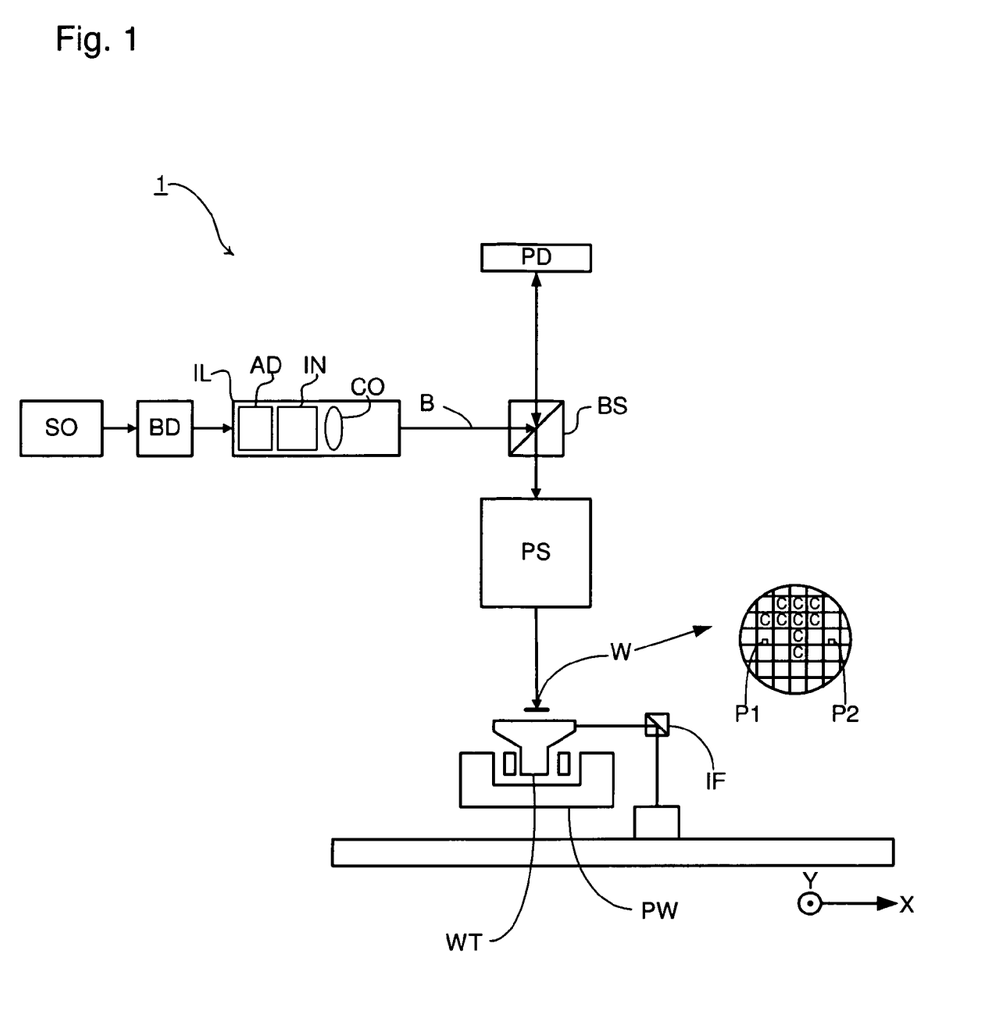
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electromechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
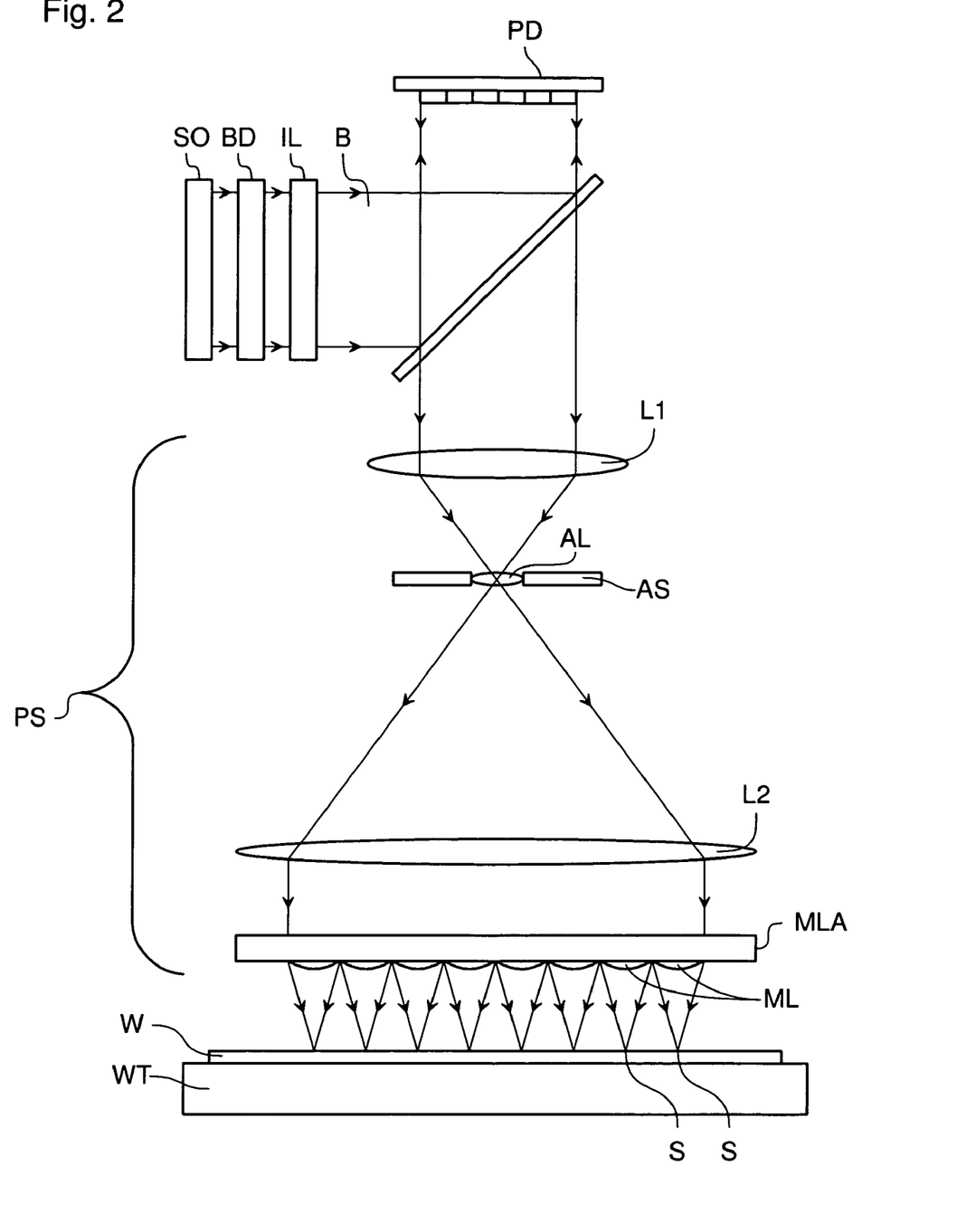

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 mm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
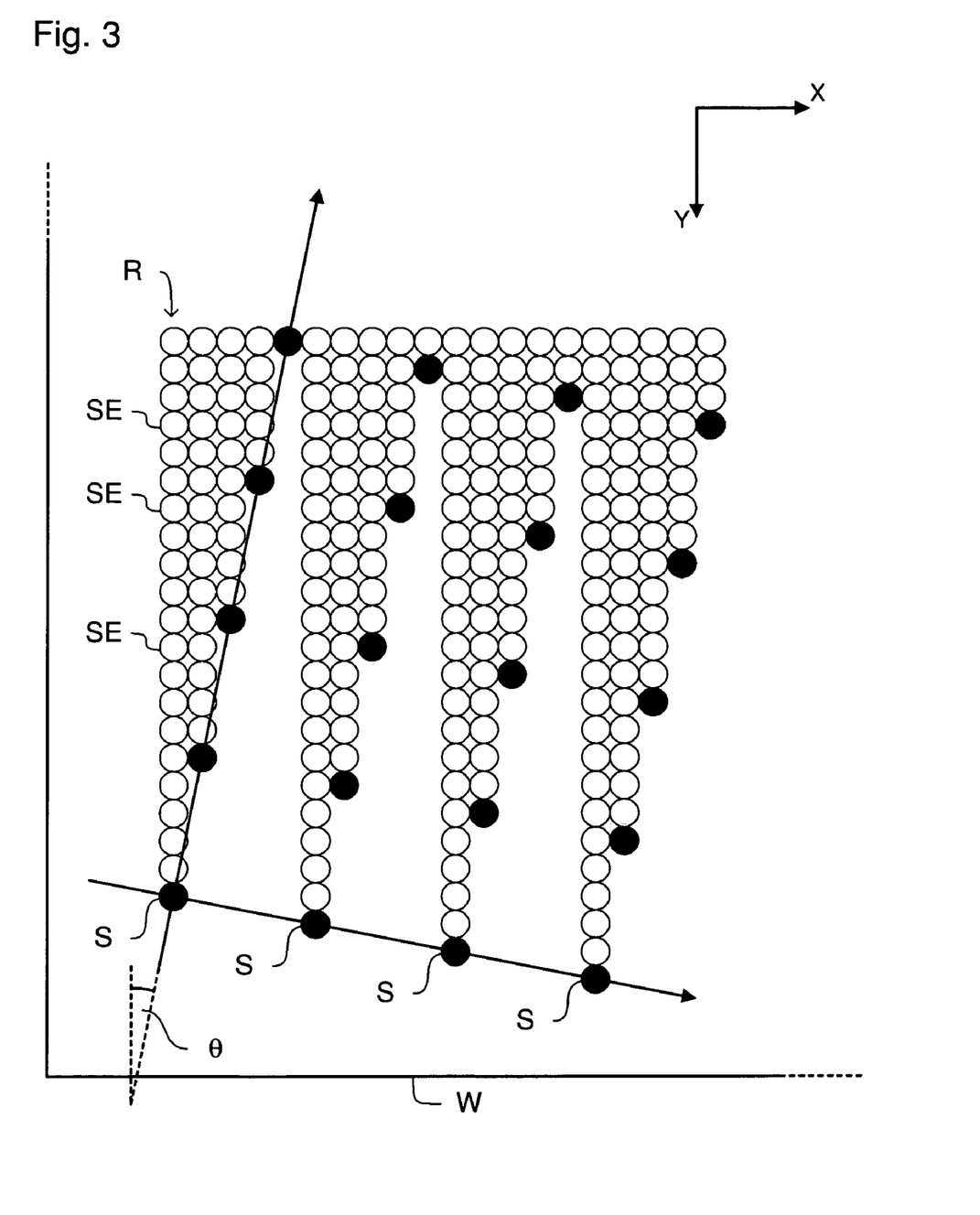
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 30, at most 1°, at most 0.5°, at most 0.25°, at most 0.10°, at most 0.05°, or at most 0.01°. Alternatively, the angle $\theta$ is at least 0.001°.

Figure 4:
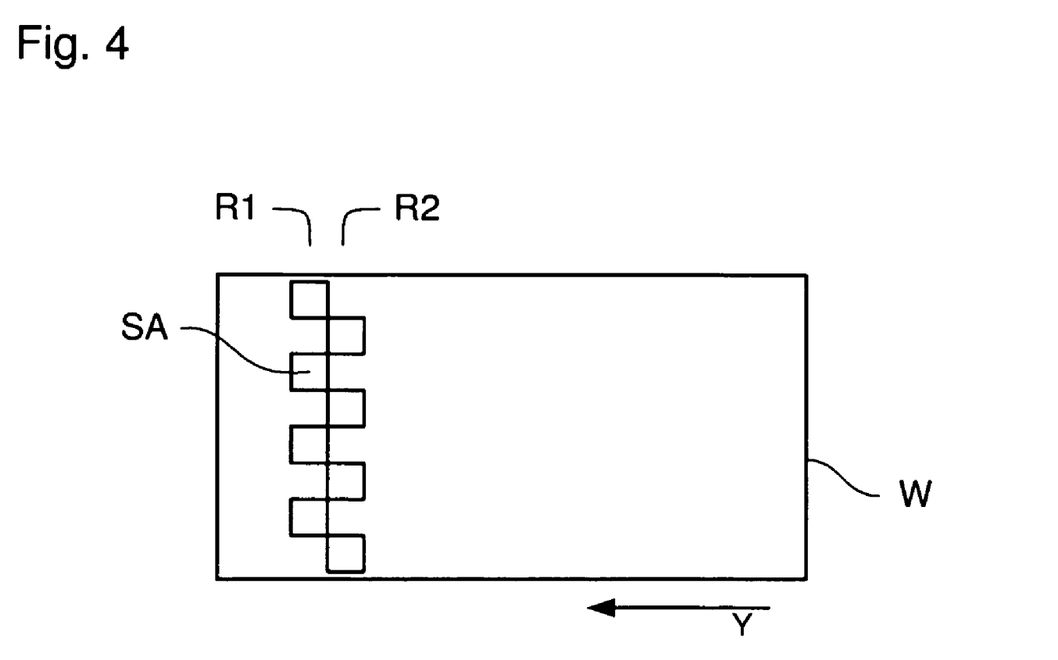
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

As mentioned in the introductory part of the description, the projection system PS is inherently bandwidth limited due to diffraction effects. In effect, the image produced by the projection system PS on the substrate W is a low pass filtered version of the image defined by the patterning device PD (whether a mask in a mask-based system, or an array of individually controllable elements in a maskless system). The low-pass threshold is defined by the properties of the projection system PS and the configuration of the illumination system IL providing the radiation, and depends, inter alia, on the following four parameters: the radiation wavelength ($\lambda$), the numerical aperture of the projection optics (NA), the size of the illuminator profile ($\sigma$), and the pupil shape. The pupil shape may, for example, be circular, annular or segmented circular or annular, such as dipole segmented, quadrupole segmented etc. The exact pupil shape determines the low-pass threshold as a function of the orientation of the image. The smallest dimension (CD) that can just be resolved with one exposure (multiple exposures can get one beyond this limit) is given by: k1=0.5 for fully coherent illumination (only filling of the central portion of the pupil) and k1 can be as small as 0.25 for fully incoherent illumination (complete filling of the pupil). The exact low pass threshold as a function of the orientation in the image is determined by the exact pupil filling, which can be varied in the illuminator IL. Examples include low-sigma (coherent illumination), conventional (partial homogeneous filling of the pupil), annular (ring-wise partial filling of the pupil), and several conventional and annular segmented schemes (dipole, quadrupole, etc.) and combinations of the above. The configuration of the illumination system can be varied to tune low-pass-thresholds and high-pass thresholds for the imaging as a function of the orientation in the image.

If not accounted for, the loss of high frequency information will cause errors in the device pattern formed after the exposed substrate W is processed, which it would be desirable to minimize or avoid.

The post-exposure processing will itself also have an effect on the device structure finally formed on the substrate W. The post-exposure bake, resist acid diffusion, development, hardbake, and etching will all have an influence on the relationship between the dose pattern exposed onto the substrate W and the device structure that emerges. The development step involves activating the acid in the resist. The properties of the resist after development are changed as a function of the acid concentration. In practice, it is expected that the post-exposure processing will have an effect broadly similar to the low-pass filtering of the projection system PS, in that it will tend to cause a reduction in the resolution of the structure formed.

As described above, at least some of these factors can be at least partially corrected by calculating OPCs to be added to the mask pattern. The OPCs can be derived using polygon-based OPC algorithms comprising the steps of evaluating the OPC quality on a (variable) grid and optimizing the correspondence between the desired and actual pattern (as evaluated using Hopkins formalism convolution of optical kernels applied to the design pattern after application of the OPCs). This is an iterative process of adjusting the OPC and evaluating the result on the image.

Alternatively, pixel-based OPC algorithms can be used running on massively parallel computation platforms running on a fixed grid and using similar Hopkins formalism to evaluate OPC quality and to reduce the deviation from the desired imaging pattern. Again, an iterative approach is used.

Both of the above OPC generation schemes assume a physical mask with homogenous properties (e.g., transmission 100% for "clear," −6% for 6%-att-PSM, −100% for alt-PSM, 0% for Cr, CPL). By "homogeneous," what is meant in this context is that a discrete number of transmission/phase combinations are used. "6%-att-PSM" requires a constant −6% intensity background level. At −100% att-PSM, the patterns are colored using either +1 or −1 transmission/intensity. This reduces the range of frequencies produced and improves resolution. The "CPL" mask type comprises positive and negative phase features with equal amplitude (as alt-PSM) and a chromium layer with sub-resolution "zebraing" layers which act effectively to tune local mask transmission.

In a maskless system, the mask is replaced by an array of individually controllable elements (e.g., tilting or pistoning mirrors of typically 2 to ½ critical dimension (CD) size, or a combination of tilt and piston) and where, for example, a phase step can be present in the tilting mirror. These mirrors can differ from a physical mask by having: (1) continuous amplitude or phase adjustability and (2) parasitic effects such as reflectivity from slits between the mirrors, hinge effects (e.g., anomalous reflection due to distortion in hinge regions), polarization dependence of their modulation properties, varying height (=phase) for tilt mirrors or varying tilt (equivalent to energy modulation, due to shift of Fourier transform in pupil plane) for piston mirrors, reflectivity variations, shape variations, etc. Also, "dead" (non-responsive), non-reflective, or partially reflective pixels can occur on the array. Other possible imperfections include elements with limited active range and variations in shape of array. The performance of the array can also depend on the particular angle of incidence of radiation (or range thereof) onto the array.

Where a maskless system is used to emulate a physical mask, the same OPCs can be used. However, for this to work most effectively, all parasitic effects in the array of individually controllable elements PD need to be made small enough to approach those of a homogeneous mask and certain flexibility of the array PD (e.g., continuous phase or amplitude adjustment) cannot therefore be fully exploited.

One embodiment of the present invention provides a method of obtaining setpoint data (i.e., data to be fed to the array(s) of individually controllable elements PD in order to define a sequence of actuation states of elements of the array PD) for example, voltages corresponding to particular degrees of displacement of individual elements, such as tilt angles and/or longitudinal displacements) that integrates the calculation of the correction data (OPCs) with the calculation of the setpoint values needed to produce a given target device structure (e.g., GDSII or OASIS file). That is to say, the method of the embodiment calculates the setpoint data required to produce the target device structure directly from the vector-based format output file representing the target device structure in a single fitting routine, without determining OPCs separately for a physical mask-based system. The fitting routine itself is adapted to take account of the same physical properties of the projection system PS (low-pass filtering etc.), illumination settings, and the effects of post-exposure processing that would be taken into account in an explicit calculation of the OPCs for a physical mask-based system. However, because the array(s) of individually controllable elements PD does not have to emulate the performance of a physical mask that has had OPCs added to it, it can in principle operate to its full capacity, making use of continuous phase and/or amplitude modulation. This approach provides a much broader parameter space for dealing with the OPC issues and they can therefore be dealt with more accurately. In addition, the detailed physical properties of the array(s) of individually controllable elements PD can also be taken into account and corrected for in the fitting routine.

The fitting routine can take into account physical properties associated with a patterning array PD of a particular type (i.e., to deal with effects common to all arrays of that type, such as the parasitic effects mentioned above). Alternatively or additionally, the fitting routine can take into account physical properties of the actual instance of the array PD, such as pixel height variations, dead pixels and other imperfections.

Accordingly, a method can be provided which comprises the following steps. Estimating the device structure that would result from applying given setpoint data (e.g., the method can start with "seed" setpoint data and deal subsequently with increasingly optimized setpoint data) to an array of individually controllable elements PD. Taking into account factors including at least some of those typically addressed by Optical Proximity Corrections (e.g., the low-pass characteristics of the projections system, the post-exposure processing). Comparing the device structure thus estimated with a target device structure to determine a device structure error. Modifying the setpoint data (how this is done will depend on the particular fitting routine to be implemented, but will aim to reduce the device structure error) and repeating the estimating and comparing steps with the modified setpoint data until the device structure error falls below a predetermined threshold. The modified setpoint data for which the device structure error is below the predetermined threshold can be output as "optimized setpoint data."

The above method does not need to use the OPC data calculated for the physical mask to be emulated because compensation for the physical factors to which the OPC correspond is performed when fitting the setpoint data to the target device structure. The result of this is that the array of individually controllable elements does not have to emulate the operation of the physical mask with OPC at the mask level. Therefore, the setpoint data does not have to be restricted to correspond with the limited abilities of the mask. Features such as continuous phase and/or amplitude control can therefore be exploited.

The above fitting routine can be seeded with approximate setpoint data, obtained for example from the target device structure without taking into account detailed effects such as the low-pass characteristics of the projection system PS, post-exposure processing, or patterning device properties. A simplified model of the patterning device can be used. For example, the patterning device can be modeled as if each of the mirrors behaves as a perfect square pixel which can be modulated. Alternatively, the fitting routine can be seeded simply with a random pattern or with some other easily generated pattern such as all 1's or all 0's.

The estimating step can comprise estimating the radiation dose pattern that would be exposed onto the substrate W as a result of applying the setpoint data to the array of individually controllable elements PD (e.g., using a model of the physical characteristics of the array of individually controllable elements PD and/or a model of the physical properties of the projection system PD). Alternatively or additionally, the estimating step can comprise estimating the device structure that would result from a post-exposure processing of the substrate W after exposure to the estimated radiation dose pattern.

The comparing step can involve a direct comparison of an expected device structure estimated in the estimating step with the target device structure or it can involve a comparison of an expected radiation dose pattern calculated in the estimating step with a target radiation dose pattern associated with the target device structure (e.g., the radiation dose pattern expected to produce the target device structure). As a further variation, the comparing step can involve comparison of mathematical entities derived by mathematical operations on the radiation dose patterns. For example, comparison can be between first or higher order spatial derivatives of the radiation dose patterns, or the NILS (normalized image log slope) of the radiation dose pattern. The mathematical operation can also include a directional dependence, which can be used to emphasize certain directions. Whichever quantity (or quantities) is (are) chosen, the iteration routine will be adapted to minimize the result of the comparison.

Alternatively or additionally, the comparing step can involve comparison with the device structure that would result from post exposure processing of a dose pattern (or with the dose pattern itself) predicted for a mask with OPC in mask-based lithography system of a particular type. By minimizing the deviation from this mask-based pattern, matching of the device structure (or associated dose pattern) for a maskless lithography system with that arising from a mask-based system with mask-based OPC can be achieved with high accuracy. This approach helps ensure equivalent imaging between two separate systems (known as "imaging transparency").

Estimation of the radiation dose pattern can comprise using a mathematical model of a reference array of individually controllable elements (i.e., an idealized version of a standard array, without imperfections such as dead pixels or other abnormalities). This approach would be useful for dealing with physical properties common to arrays of individually controllable elements of a given type or range of types. The mathematical model can provide a means to convert setpoint data to be applied to the array to an expected radiation output profile from the array.

The mathematical model of the reference array can take into account reflection from slits between elements, element reflectivity, polarization dependence, and hinge effects, for example. More generally, the model can operate by calculating an explicit solution to Maxwell's equations for diffraction from the reference array. An asymptotic approximation of Maxwell's equations can also be used for this purpose. Calibration measurements can also be used to determine the properties of the reference array.

Estimation of the radiation dose pattern can comprise using of a mathematical model of a particular instance of the array of individually controllable elements. In addition to the general properties of the array that can be taken into account by the mathematical model of the reference array, this approach allows imperfections in a particular array, such as dead pixels or localized variations in element actuation and/or neutral positions, also to be taken into account. Calibration measurements can also be used to determine the properties of the particular instance of the array.

Estimation of the radiation dose pattern can comprise use of a mathematical model of the projection system PS. This mathematical model would, for example, take account of the low-pass characteristics caused by diffraction. It could also be adapted to take into account other general properties of the projection system PS and, optionally, could address specific imperfections in a particular projection system.

Estimation of the radiation dose pattern can also take into account relevant details of the illumination scheme, for example the exact pupil shape (conventional, annular, multipole, conventional/annular with specified inner sigma and outer sigma, such as dipole, quadrupole, sextupole etc., with specified segment annular widths, or any combination) or any pupil filling as achieved by a custom-made diffractive optical element, for example. Estimation can also take into account the size and orientation of the process window (the region exposed at any one time on the substrate) and the way in which the final dose pattern is tiled together from individual exposures. The dose pattern in areas of overlap between adjacent tiles combines incoherently, which needs to be taken into account when calculating the final dose pattern. Low pass effects from the projection system, for example, may need to be calculated individually for each tile.

Estimation of the device structure that would result from post-exposure processing can also be achieved using one of more mathematical models representing the effects of various different factors. These mathematical models together represent an expected relationship between the final dose pattern exposed onto a substrate W and the device structure that will be formed by the post-exposure processing. The mathematical models may, for example, take into account one of more of the following processes: post exposure bake, resist acid diffusion, development, hardbake, deposit, implant, immersion (i.e., where the substrate is submerged in an immersion fluid during exposure), and etching.

Figure 5:
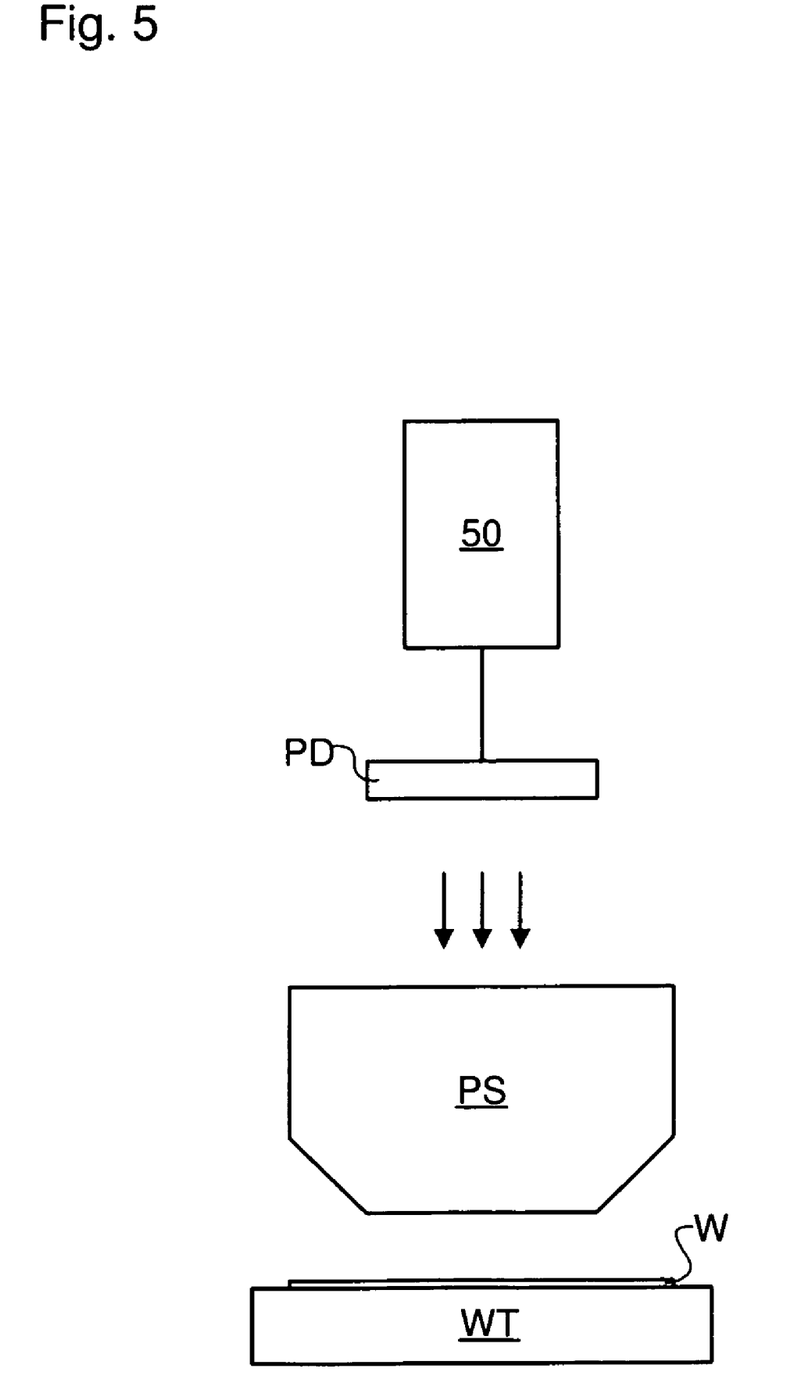
FIG. 5 depicts a lithographic system with an array of individually controllable elements and a setpoint data optimizer.

FIG. 5 shows an example embodiment of a lithographic apparatus. An array of individually controllable elements PD is provided for modulating a radiation beam to be projected by projection system PS onto a substrate W on substrate table WT. Setpoint data optimized according to a method of an embodiment of the present invention is provided via setpoint data optimizer 50.

Figure 6:
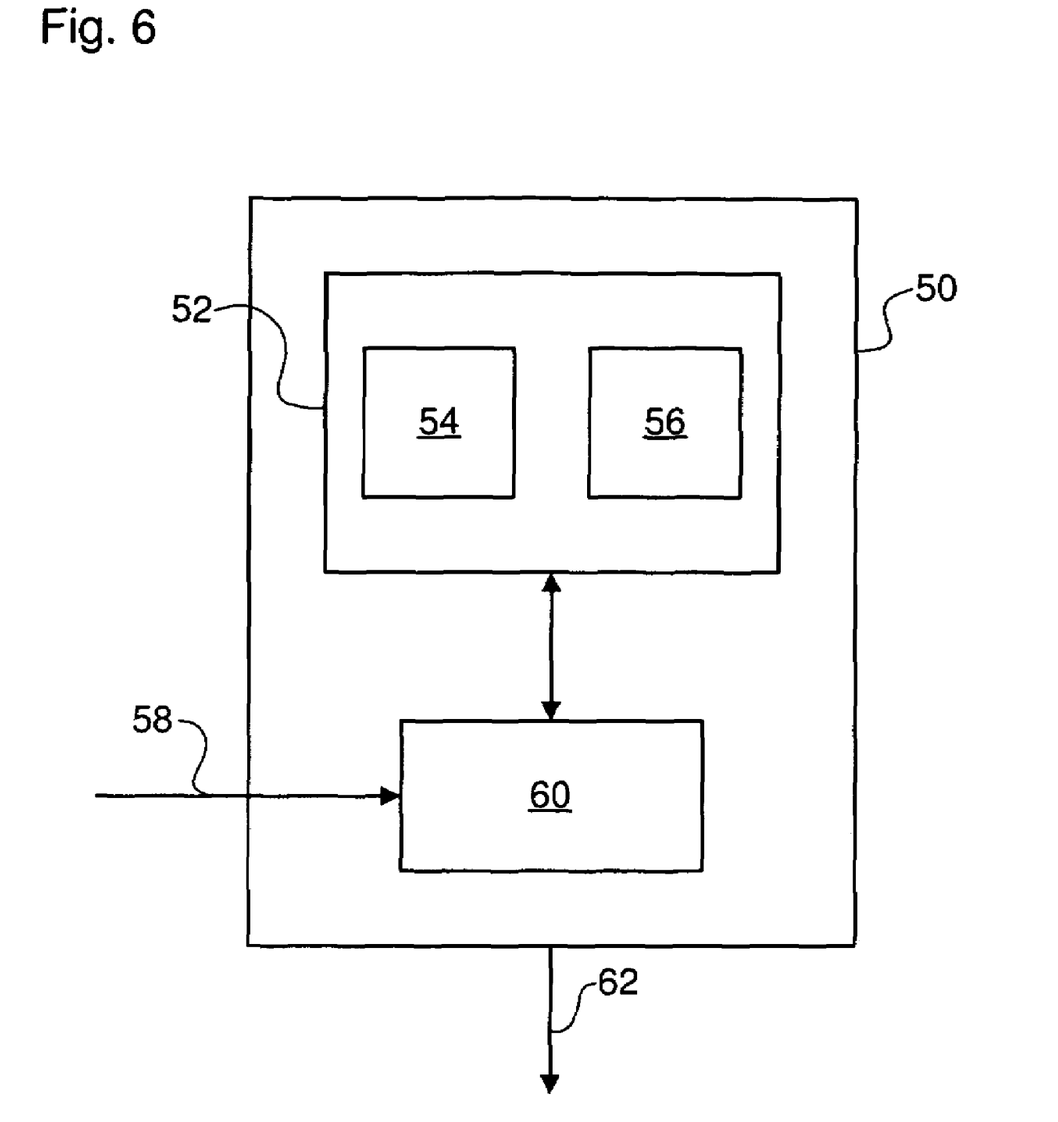
FIG. 6 depicts a setpoint data optimizer.

FIG. 6 shows in more detail how the setpoint data optimizer 50 can be configured. According to this embodiment, the setpoint data optimizer 50 comprises a device structure estimating device 52 for estimating the device structure that would result from applying given setpoint data to the array of individually controllable elements PD and processing the resulting exposed substrate W after exposure. The device structure estimating device 52 can comprise a radiation dose estimator 54 configured to estimate the radiation dose that would be exposed onto the substrate W as a result of applying given setpoint data to the array of individually controllable elements PD. Additionally or alternatively, the device structure estimating device 52 can comprise a post-exposure processing estimator 56 configured to estimate the device structure that would result from post-exposure processing of a substrate W exposed with a given radiation dose pattern.

The setpoint data optimizer 50 can further comprise a comparator 60, which compares an estimated device structure output from the device structure estimating device 52 with a target device structure 58 input by a user (for example as a GDSII file). The difference between the estimated and target device structures is used to determine a device structure error. The setpoint data optimizer 50 compares the device structure error with a predetermined threshold to determine if the device structure is within acceptable bounds (i.e., sufficiently close to the target device structure). If the device structure error is too high, the iteration controller repeats the process with different setpoint data iteratively until the device structure error falls below the predetermined threshold. Setpoint data for which the error is acceptable can be output as "optimized setpoint data" 62. The setpoint data can be modified using a merit function, for example using a least-squares method. The merit function can be evaluated either in the spatial domain or in the frequency domain. The merit function can also include data in-focus and off-focus and/or a weighted average of these to find solutions that are optimal over a certain focus range as opposed to solutions that are optimal in focus and degrade more rapidly through focus. Similarly, merit data through dose can be used to find solutions that are more robust through dose as opposed to optimal for a certain dose and more rapidly degrading through dose. Typical focus windows are a few times 100 nm to 1000 nm (degrading with higher NA). Typical dose windows are 10-15%.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of producing optimized setpoint data for controlling actuation of elements of an array of individually controllable elements configured to modulate a radiation beam in a maskless lithography system, the maskless lithography system having an illumination system configured to condition the radiation beam and a projection system configured to project the modulated radiation beam onto a substrate, the method comprising:
   a) obtaining starting setpoint data representing an ideal device structure;
   b) estimating the device structure that would result from applying the starting setpoint data to the array of individually controllable elements configured to modulate a radiation beam, wherein estimating further comprises:
      b1) estimating the radiation dose pattern that would be exposed onto the substrate as a result of applying the setpoint data to the array of individually controllable elements;
      b2) estimating the device structure that would result from a post-exposure processing of the substrate after exposure to the estimated radiation dose pattern;
   c) comparing the device structure estimated in step (b) with a target device structure to be formed on a substrate to determine a device structure error;
   d) modifying the setpoint data and repeating steps (b) and (c) using the modified setpoint data instead of the starting setpoint data until the device structure error falls below a predetermined threshold; and
   e) outputting the modified setpoint data for which the device structure error is below the predetermined threshold as the optimized setpoint data, whereby the array of individually controllable elements is actuated based on the modified setpoint data.

2. The method according to claim 1, wherein the estimating step (b) utilizes at least one of the following factors: low-pass characteristics of the projection system, a configuration of the illumination system, and process window properties.

3. The method according to claim 1, wherein the starting setpoint data is obtained based on the target device structure.

4. The method according to claim 1, further comprising:
   estimating the device structure expected to result from exposure of a substrate in a reference lithography device; and
   using the device structure thus estimated as the target device structure.

5. The method according to claim 4, wherein the reference lithography device is a mask-based lithography device using a mask comprising optical proximity corrections.

6. The method according to claim 1, wherein step (b1) comprises:
   using a mathematical model representing the performance of a reference array of individually controllable elements, the reference array being a mathematical construct of an idealized, error-free version of a particular design of array.

7. The method according to claim 6, wherein the mathematical model utilizes the following property of the reference array: reflection from slits between elements, element reflectivity, polarization dependence, hinge effects, or specific angle of incidence of radiation on the reference array.

8. The method according to claim 7, wherein the mathematical model is based on calculating an at least approximate solution to Maxwell's equations for the diffraction behavior of the reference array.

9. The method according to claim 1, wherein step (b1) comprises:
   using a mathematical model representing performance of a particular instance of an array of individually controllable elements, the mathematical model utilizes deviations from the reference array due to imperfections in the particular instance.

10. The method according to claim 9, wherein the mathematical model utilizes: element height variations, non-responsive elements, elements with limited active range, variations in element surfaces, variations in array shape, variations in element reflectivity, sharpness of the phase step, or particular dielectric properties of the material of which the element is made.

11. The method according to claim 1, wherein step (b1) comprises:
using a mathematical model representing performance of a reference projection system, the reference projection system being a mathematical construct of an idealized, error-free version of a particular design of projection system.

12. The method according to claim 11, wherein step (b1) comprises:
using a mathematical model representing the performance of a particular instance of a projection system, the mathematical model utilizes deviations from the reference projection system due to imperfections in the particular instance.

13. The method according to claim 1, wherein step (b1) comprises:
using a mathematical model representing performance of a reference illumination system, the reference illumination system being a mathematical construct of an idealized, error-free version of a particular design of illumination system.

14. The method according to claim 13, wherein step (b1) comprises:
using a mathematical model representing the performance of a particular instance of an illumination system, the mathematical model utilizes account deviations from the reference illumination system due to imperfections in the particular instance.

15. The method according to claim 1, wherein step (b2) comprises using a mathematical model of the post-exposure processing.

16. The method according to claim 15, wherein the mathematical model represents a relationship between the radiation dose pattern exposed onto the substrate and a device structure that is expected to emerge after the post-exposure processing.

17. The method according to claim 16, wherein the mathematical model utilizes the effects of post exposure bake, resist acid diffusion, development, hardbake, deposit, implant, immersion, or etching.

18. The method according to claim 1, wherein the comparison in step (c) is based on an estimated radiation dose pattern associated with the estimated device structure and an estimated radiation dose pattern associated with the target device structure.

19. The method according to claim 1, wherein in step (d) the setpoint data is modified or optimized using a merit function, a least-squares method in either the spatial domain or the frequency domain, at substrate level, at a particular focus or through a range of focus, or at a particular dose or through a range of dose.

20. A device manufacturing method comprising:
obtaining starting setpoint data representing a target device structure;
estimating a resultant device structure that would result from applying the starting setpoint data to an array of individually controllable elements configured to modulate a radiation beam, wherein estimating further comprises:
estimating the radiation dose pattern that would be exposed onto the substrate as a result of applying the setpoint data to the array of individually controllable elements;
estimating the device structure that would result from a post-exposure processing of the substrate after exposure to the estimated radiation dose pattern; and
comparing the resultant device structure estimated in the estimating with the target device structure to be formed on a substrate to determine a device structure error;
modifying the setpoint data;
repeating the estimating, comparing, and modifying using the modified setpoint data instead of the starting setpoint data until the device structure error falls below a predetermined threshold;
outputting the modified setpoint data for which the device structure error is below the predetermined threshold as the optimized setpoint data;
modulating the radiation beam using the array of individually controllable elements actuated using the optimized setpoint data; and
projecting the modulated radiation beam onto a substrate.

21. A flat panel display manufactured according to the method of claim 20.

22. An integrated circuit device manufactured according to the method of claim 20.

23. A lithographic system, comprising:
an illumination system configured to condition a radiation beam;
an array of individually controllable elements capable of modulating the radiation beam;
a setpoint data optimizer configured to produce optimized device structure setpoint data by estimating, iteratively, a device structure, using device structure setpoint data, until a difference between the estimated device structure and a target device structure to be formed on a substrate is smaller than a predetermined threshold, and apply the optimized setpoint data to the array of individually controllable elements, wherein estimating further comprises:
estimating the radiation dose pattern that would be exposed onto the substrate as a result of applying the setpoint data to the array of individually controllable elements;
estimating the device structure that would result from a post-exposure processing of the substrate after exposure to the estimated radiation dose pattern; and
a projection system configured to project the modulated radiation beam onto a substrate.

24. An apparatus for producing optimized setpoint data for controlling actuation of elements of an array of individually controllable elements configured to modulate a radiation beam in a maskless lithography system, the maskless lithography system having an illumination system configured to condition the radiation beam and a projection system configured to project the modulated radiation beam onto a substrate, the apparatus comprising:
a device structure estimating device configured to estimate a device structure that would result from applying given setpoint data, representing the device structure, to the array of individually controllable elements configured to modulate the radiation beam, wherein estimating further comprises:
estimating the radiation dose pattern that would be exposed onto the substrate as a result of applying, the setpoint data to the array of individually controllable elements;
estimating the device structure that would result from a post-exposure processing of the substrate after exposure to the estimated radiation dose pattern; and a setpoint data optimizer arranged iteratively to estimate the device structure using the device structure estimated device and different setpoint data until a difference between the estimated device structure and a target device structure to be formed on a substrate is smaller than a predetermined threshold, thus determining optimized setpoint data.

25. A lithographic system, comprising:

an illumination system configured to condition a radiation beam;

an array of individually controllable elements capable of modulating the radiation beam;

a projection system configured to project the modulated radiation beam onto a substrate; and an apparatus for producing optimized setpoint data comprising, a device structure estimating device configured to estimate a device structure that would result from applying given setpoint data, representing the device structure, to the array of individually controllable elements configured to modulate the radiation beam, wherein estimating further comprises:

estimating the radiation dose pattern that would be exposed onto the substrate as a result of applying the setpoint data to the array of individually controllable elements;

estimating the device structure that would result from a post-exposure processing of the substrate after exposure to the estimated radiation dose pattern; and a setpoint data optimizer arranged iteratively to estimate the device structure using the device structure estimated device and different setpoint data until a difference between the estimated device structure and a target device structure to be formed on a substrate is smaller than a predetermined threshold, thus determining optimized setpoint data.

* * * * *